United States Patent [19]

Greenman

[11] Patent Number: 4,720,315
[45] Date of Patent: Jan. 19, 1988

[54] METHOD FOR PREPARING A SELECTIVELY DECORATED RESIN FILM

[75] Inventor: Joseph Greenman, Plainfield, N.J.

[73] Assignee: Transfer Print Foils, Inc., East Brunswick, N.J.

[21] Appl. No.: 904,780

[22] Filed: Sep. 5, 1986

Related U.S. Application Data

[63] Continuation of Ser. No. 576,603, Feb. 3, 1984, abandoned.

[51] Int. Cl.$^4$ .......................... B44C 1/16; B32B 31/00; B05D 1/32
[52] U.S. Cl. ..................................... 156/233; 156/234; 156/241; 156/254; 427/272
[58] Field of Search ............... 156/152, 230, 233, 234, 156/241, 240, 238, 239, 246, 249, 254, 250; 427/259, 272, 273

[56] References Cited

U.S. PATENT DOCUMENTS

| | | | |
|---|---|---|---|
| 4,012,552 | 3/1977 | Watts | 156/233 |
| 4,454,179 | 6/1984 | Bennett et al. | 156/234 |
| 4,473,422 | 9/1984 | Parker et al. | 156/233 |
| 4,484,970 | 11/1984 | Burzlaff et al. | 156/234 |

FOREIGN PATENT DOCUMENTS

56-55282  5/1982  Japan .................... 156/233

Primary Examiner—Donald E. Czaja
Assistant Examiner—Louis Falasco
Attorney, Agent, or Firm—Popper, Bobis & Jackson

[57] ABSTRACT

A method for the preparation of selectively decorated resin films comprises applying a first primer coat to the entire area of the base film, then applying either a masking coat alone or one or more color coats followed by the masking coat, the masking coat applied to an area of the base film that will define the final selective decoration. The masking coated surface is thereafter metalized and the resulting composite is joined to a mask-removing film bearing a pressure-sensitive adhesive having a limited peel strength known as "soft peel". The process is completed by the separation of the respective films, with the mask removing film withdrawing from the base film the unwanted portions of the metal coat and its underlying masking coat, to leave a crisp, patterned decoration.

The present process requires no solvents and is therefore environmentally preferred. In addition, the method may be easily and inexpensively practiced on a continuous basis and offers the reliable production of aesthetically superior decorations.

14 Claims, 3 Drawing Figures

METHOD FOR PREPARING A SELECTIVELY DECORATED RESIN FILM

This application is a continuation of application Ser. No. 576,603 filed Feb. 3, 1984, abandoned.

BACKGROUND OF THE INVENTION

1. Field of the Invention

The present invention relates to the preparation of decorated resin films, and particularly to the preparation of such films as are metalized on selective areas.

2. Description of the Prior Art

Selectively decorated films have had a variety of decorative and technical utilities that have made them popular over the years. In particular, selective metalization has been utilized for products as divergent as gift wrapping paper, embellished mirrors and electrical apparatus, the latter of increasing importance with the advent of the broad usage of printed circuit technology.

For example, U.S. Pat. No. 2,000,310 to White et al discloses the use of a resist coating which is applied to the rear surface of glass so that a particular design may be defined on the mirror after silvering of the glass surface is completed and the resist is removed. The technology in White et al relates to the old art of silvering and is distinguishable from the present invention.

In U.S. Pat. No. 2,139,640 to Mall et al, the patentees employed a grease or oil substance as a mask on surfaces to be metalized, to achieve selective metalization or pattern making. The use of oil or grease results in a liquid coating which remains in the liquid state after metalization, so that removal of the excess metal is accomplished by wiping the surface to remove the oil or grease mask. This technique would be unsuitable for use with the metalized products prepared for contemporary applications.

More recently, numerous approaches have been taken in an effort to adapt the technique of selective metalization by use of a resist or mask, to the production of printed circuit boards or integrated circuits (ICs). Thus, U.S. Pat. No. 3,554,780 to Miller et al discloses the use of an acid-resistant coating as a resist or mask, which may be a dispersion of vinyl copolymers having at least 4% by weight of a carboxylic acid. The mask is removable by an alkaline agent such as ammonium hydroxide. The drawback of the use of the Miller et al system is its limited applicability by virtue of the use of an alkaline solvent, and the possibility that such solvent may attack certain of the materials used in a particular metalized lamination or the like.

A more pertinent disclosure is that of U.S. Pat. No. 3,935,334 to Narui et al. In this patent, a water soluble coating is applied within specific critical thickness limits by techniques such as screen printing, gravure coating and the like, to give a specific coating pattern. Thereafter, the surface bearing the dielectric coating and the masking coating on top of it, are metalized. After metalization is complete, the surface may be washed with water, and the water soluble mask will dissolve, taking with it the portion of the metal layer deposited thereover. As noted, the Narui et al system requires the observance of specific tolerances in the thickness of the resist layer to be fully operable.

A variety of alternate techniques utilizing solvents and/or photopolymerizable compositions to which masks or resists are applied are disclosed in the following U.S. Pat. Nos. 4,059,708 to Heiss, Jr. et al; 4,089,686 to Townsend; 4,270,985 to Lipson et al; and, 4,346,125 to Kinsbron et al.

While the above techniques have all been directed to overcome the deficiencies noted in the prior art with regard to the masking methods for selective metalization, many of these deficiencies still remain. Thus, it is noted that Narui et al discusses a variety of techniques including the tape-masking method and oil-masking method and distinguishes these methods and their deficiencies by noting that the prior art methods failed to define an acceptable "margin edge". The "margin edge" is, as it implies, the border or perimeter of the metalized layer that is defined when the mask or resist is removed from the metal-coated film or base. The solvent-based techniques exemplified by Narui et al have been tested and suffer from the same deficiencies that the patentees outlined with respect to the prior art. Thus, and particularly in the instance where such techniques are employed to mass produce decorative selectively metalized film, the resulting products exhibits either a non-uniform marginal edge, or in some instances such as in the case of intricate metal designs, the entire design is distorted and frequently bears an etched appearance.

Added to the foregoing visual deficiencies in the final product, are the complexities and inefficiencies of the solvent based system. The product must therefore be exposed to solvent action which by itself is difficult to control, and to such extent, detracts from the uniformity and reproducibility of the desired selective pattern.

A need therefore exists for a method for the selective metalization of resinous materials which is highly reproducable and offers a superior marginal edge with a minimum of criticality and complexity in post-metalization processing.

SUMMARY OF THE INVENTION

In accordance with the present invention, a method for the preparation of a selectively metalized resin film is disclosed which comprises providing a printable resin base film, applying over the base film a primer coat that is adhesive with respect to the base film, thereafter applying to said primer coat a masking coat which is adhesive with respect to the primer coat in a predetermined pattern, after which a metal coat is applied to the entire coated surface of the base film. After metalization is completed, the resulting film is laminated to a second mask-removing film bearing a pressure-sensitive adhesive on one surface, so that the pressure-sensitive adhesive is placed in intimate contact with the metal coat. The two films may be promptly separated after lamination by known means, whereupon the film bearing the pressure-sensitive adhesive will draw the portion of the metal coat and the masking coat over which it is disposed away from the composite base film, leaving the metalized layer clearly defined in its intended pattern.

The present method is useful with a variety of substrates and therefore numerous base films may be used herein. Likewise the abhesive masking coating may be one that has a limited affinity for the base film, and would include wax compositions, gum compositions and certain resin compositions containing gelatin, starch, polyvinyl alcohol, and similar materials. The primer coat may be selected from a variety of materials known to offer a relatively firm surface, and to thereby promote the achievement of a uniform marginal edge when the masking coat is removed. Thus, primers include acrylic polymers and copolymers, vinyl polymers and copolymers, polyesters and the like. The pressure-sensitive adhesive utilized with the mask-removing film should be one having a peel strength known in the art as "soft peel", so that it can offer sufficient adhesive attraction to dislodge the masking coat, while retaining the remainder of the metalized composite intact on the base.

The present system offers a variety of advantages among them simplicity and uniformity of operation. The masking coat is easily applied by standard techniques such as screen printing, gravure coating and the like, and may optionally be combined with the disposition of pigmented coatings in the areas not covered by the mask. In such instances, multiple coating steps may be employed to develop decorations having a variety of indicia in addition to the specific patterned metalization.

The removal of the masking coat may be done in line on a continual process, so that for example, upon completion of metalization, the mask-removing film may first be laminated to the base film and thereafter drawn away for example, by pulling apart the laminate as it emerges from a set of idler rollers. The use of solvents and other materials that detract from reproducability and uniformity is eliminated. Likewise, the employment of solvents which in some instance involves the emission into the air of undesirable and potentially toxic vapors, is likewise avoided.

Accordingly, it is a principal object of the present invention to provide a method for the selective metalization of resin films.

It is a further object of the present invention to provide a method as aforesaid that is uniform and reproducable, and offers a metalized pattern with improved marginal edges.

It is a still further object of the present invention to provide a method which may be simply and inexpensively practiced as an in-line technique.

It is a yet further object of the present invention to provide a method as aforesaid that avoids the environmental difficulties associated with solvent-based mask removal techniques.

Other objects and advantages will become apparent to those skilled in the art from a review of the ensuing description which proceeds with reference to the following illustrative drawings.

DETAILED DESCRIPTION

Figure 1:
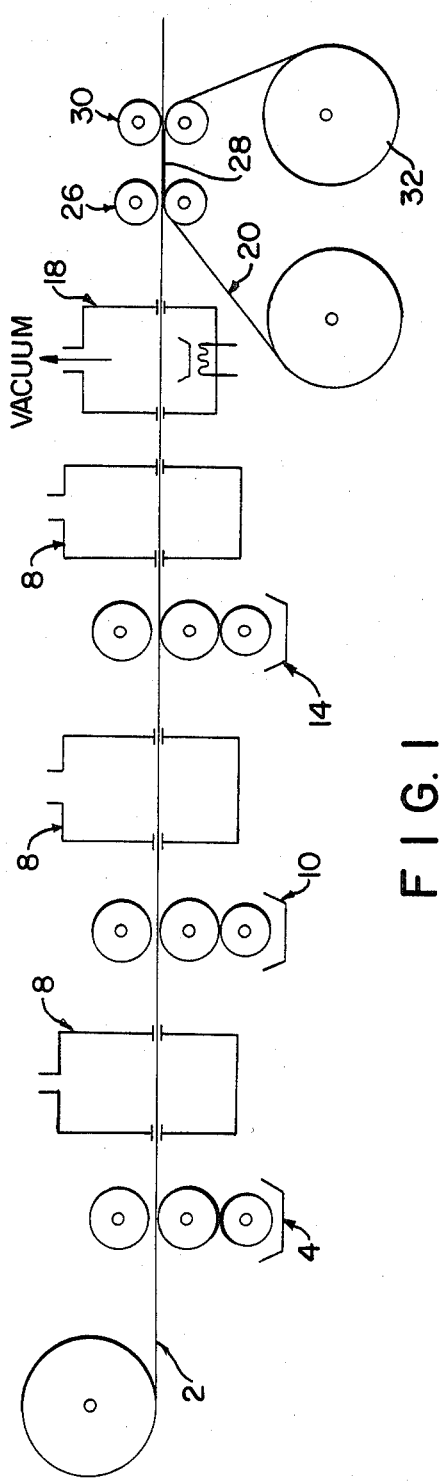
FIG. 1 is a schematic representation of the process of the present invention.

The present invention relates to a method for the preparation of a selectively metalized resin film. By the present method, a base film is first coated over the entire surface thereof with an adherent primer coat. After the application of the primer coat an abhesive masking coat is applied in a predetermined pattern to define the outer border of a later applied metalized layer. Thereafter, the surface bearing the masking coat is metalized by vapor deposition. The thus coated base film is laminated to a second mask-removing film by the application of pressure and/or heat. The mask-removing film bears a pressure-sensitive adhesive coating that exerts an attraction for the metalized coat that is sufficient to overcome the attraction between the masking coat and the underlying primer coated base film. Thus, the formed laminate may be separated after passage between idler rolls or the like, and the mask-removing film will draw with it the unwanted portions of the metalized layer that were deposited over the masking coat, leaving a crisp metalized pattern defined on the base film.

Base films useful in accordance with the present invention may be prepared from a variety of thermoplastic and thermosetting resinous materials, including polyester resins, polycarbonate resins, substituted and unsubstituted vinyl polymers and their copolymers, polyurethanes, acrylic polymers and copolymers, and natural resins such as cellulose and its derivatives, including its ethers and esters.

More particularly, the polyester resins may include polyethylene terephthalate; polycarbonate resins include ABS resins; vinyl polymers would include polyvinyl chloride, polyvinyl alcohol or polyvinyl acetate, their homopolymers and copolymers; acrylic polymers and copolymers include the polymers of acrylic acid, methacrylic acid, their esters and mixtures thereof; polyolefins include polyethylene, polypropylene, and polystyrene; polyurethanes include the well known reaction product of Bisphenol A and epichlorohydrin, as well as polyurethanes formed with a polyol and an aliphatic isocyanate; cellulose derivatives would include cellulose ethers and esters, such as ethylcellulose, cellulose acetate, and cellulose acetate butyrate. The foregoing group of materials is not exhaustive but illustrative of various resins that may serve in the formation of base films. Such resins may be amorphous or oriented, and may thus possess properties that will vary with the application to which the metalized film is ultimately put. The present invention is not limited to a specific base film for its practice. The base film may in thickness depending upon end utility, with thickness of 0.5 mil to 10 mil exemplary.

A primer coat is applied to the base film to assure the uniformity and crispness of separation of the later applied masking coat at its lateral border, or marginal edge. Suitable materials useful as the primer coat include acrylic polymers and copolymers, vinyl based polymers and copolymers, polyester compositions and cellulose derivatives. More particularly, cellulose derivatives such as nitrocellulose, vinyl polymers based on vinyl chloride, vinylacetate, their homopolymers and copolymers as well as polyesters such as polyethylene terephtalate, may be used. The exact composition of the primer coat may therefore vary, so long as it provides the desired hardness and sufficient adhesion to both the base film and the next applied metalized coating. The primer coat may vary in thickness depending upon the end use of the decorated base film, with thicknesses ranging from about 0.2 to 5 mil exemplary.

After the application of the primer masking coat, a masking coat is applied in the selective manner as indicated. The masking coat is an abhesive composition that is capable of being cleanly mechanically removed from the primer coat after metalization. Suitable masking coats include well known wax coatings that are utilized as release coats, as well as gum compositions such as gum acacia, gum tragacanth, guar gum, and the like; gelatin, vinyl polymers, such as polyvinyl acetate, polyvinyl alcohol, and others. A particular release coat is a catalyzed silicone resin identified as a "paper release"

resin. Such resins are manufactured by the General Electric Company, and are disposed in a toluene solution. A particular resin comprises dimethyl siloxane, and suitable catalysts include amino-substituted silanes and organometallic compounds such as dibutyltindiacetate. Naturally, the foregoing materials are illustrative of those useful as the masking coat, and the present invention contemplates other similar materials within its scope. The masking coat may be applied in various thicknesses as well, with thickness of 0.2 mil to 4 mil exemplary.

In some instances, the base film may receive one or more variant color coatings from numerous ink or paint-type compositions, prior to or simultaneously with the application of the masking coat. Suitable color coats may be prepared from paint or ink compositions known in the art, and may include dye or pigment-containing resins of the type identified as suitable for the primer coat. In fact, in some instances, the primer coat may contain a colorant and may accordingly comprise the color coat, as well. Thus, for example, a pigmented nitrocellulose composition may be utilized and may be applied by appropriate gravure, offset or flexographic printing techniques to the desired exposed areas of the base film. In the instance where a compound decoration is contemplated, the ink or paint composition may be applied by screen printing techniques or the like to selected areas of the primer coat, to enable the subsequently applied metal coat to appear through the earlier applied transparent primer coat.

The metal layer or coat applied after the masking coat is selected from those known metals utilized in vapor deposition, including both precious and non-precious metals, such as gold, silver, tin, zinc, chromium and aluminum. Generally, aluminum is the preferred metal and is applied by known techniques such as vacuum or vapor deposition to thicknesses ranging up to about 400 Angstroms or greater. The thickness of the metal coat or layer is discretionary and will vary with the intended application of the decorated base film.

Referring now to FIG. 1, the method of the present invention is schematically portrayed and it can be seen that base film 2 is paid out from an appropriate source and first passes through a coating station 4 wherein the primer coat 6 is applied to the entire surface of film 2. Coating station 4 is displayed schematically, however it is to be understood that the application of the primer coat can be conducted by numerous art recognized techniques, including screen printing, flexographic and offset printing processes and the like. As mentioned earlier, primer coat 6 provides a smooth surface that is adherent to subsequently applied color and/or metal coats, but is relatively abhesive to the masking coat to facilitate crisp fracture of the metal coat as later described. After the application of primer coat 6 is complete, the base film 2 bearing the same may pass through a drying tunnel 8, to permit primer coat 6 to thoroughly dry prior to the performance of the next operation.

Base film 2 bearing primer coat 6 is passed through a further color coating station 10 which in one embodiment of the invention, may apply a colored coat 12, such as an ink, paint or the like, either over the entire surface of primer coat 6, or selectively in a predetermined pattern, as described above, in the instance where a multi-colored or composite decoration is desired. Accordingly, color coating station 10 is likewise schematically portrayed and it is to be understood that appropriate apparatus and corresponding techniques for selective application of the color coat 12 may be employed.

While the present disclosure has proceeded with reference to the discussion of selective metalization, it is to be understood that this selective decorating technique may apply in instances where no metalization takes place at all. In such instance, one or more color coats 12 applied at color coating station 10 or a series of such coating stations, may comprise the entirety of the decoration applied to base film 2. Naturally, the invention comtemplates this variation within its scope, as well as the instance wherein no color coat is applied at all.

The coated base film 2 emerging from either primer coating station 4 or color coating station 10, the latter in the instance where an initial color coat has been applied, is now directed through a masking coating station 14 wherein a masking coat 16 is applied. As mentioned earlier, masking coat 16 is selectively applied in a predetermined pattern that will define the outer border of the ultimate metalized decoration. In some instances, both masking coat 16 and a color coat 12 may be simultaneously applied to mutually exclusive areas on the coated base film. As with the previously applied coatings, masking coat 16 may be exposed to gentle heat to cause its complete drying after application by passage through a drying tunnel also labeled 8 in FIG. 1.

After the application of masking coat 16, the base film 2 bearing the same may be passed through a vacuum deposition chamber illustrated schematically at 18. The technique of vacuum deposition or vapor deposition is well known in the art, and further elaboration thereon is not believed necessary herein.

After metalization, the base film 2 is laminated to mask removing film 20. Masking-removing film 20 may be prepared from a variety of known films used for carriers, base films and the like, and suitable materials for the same have been enumerated hereinabove with respect to base film 2. Mask-removing film 20 preferably bears on its surface an adhesive coat 22 prepared from a composition having a peel strength known as "soft peel" to offer sufficient adhesive attraction to cause the crisp fracture and separation of the metalized coat 24 and the underlying masking coat 16, from the remainder of the primer-coated base.

Suitable pressure-sensitive adhesive compositions for adhesive coat 22 include both natural and synthetic resin compositions such as polyvinylacetate; polyvinyl alcohol; cellulose ethers and esters; shellac; and rubber compositions such as polyisobutylene; polyisoprene (natural rubber); a copolymer of 1, 3-butadiene and acrylonitrile (Buna N rubber); neoprene (polychloroprene); a copolymer of styrene and butadiene (SBR); a copolymer of isobutylene and isoprene (butyl rubber); and others. Naturally, the foregoing compositions may be adjusted in their adhesive strength by preparation in combination with each other and with other adhesive compositions, or by their disposition in appropriate solvents. In most instances, dilution with known compatible organic solvents can be utilized as a manner of adjusting the strength of attraction of the adhesive.

Figure 2:
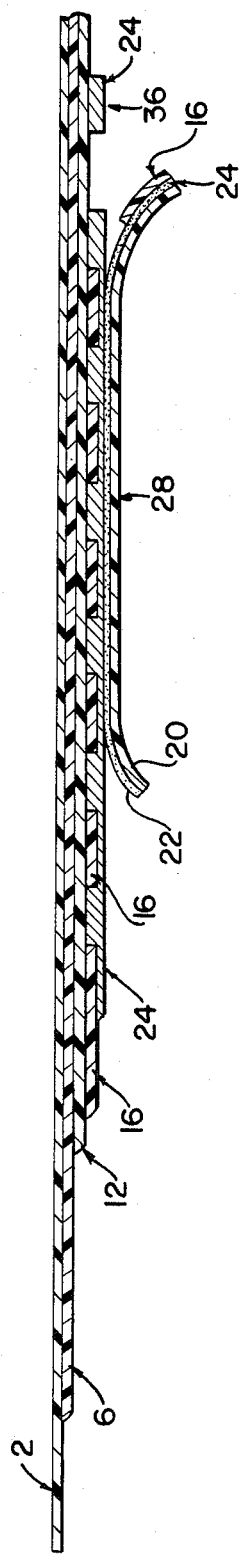
FIG. 2 is a schematic representation illustrating the state of preparation of the product at the various points of the process illustrated in FIG. 1.

Referring further to FIG. 1, mask removing film 20 is brought into adhesive contact with the coated surface of base film 2 as shown, so that the adhesive coat 22 disposed on mask-removing film 20 is brought into pressured contact with the metalized coat 24, as illustrated in FIG. 2, or directly with a color coat disposed over masking coat 16, in the instance where no metalization is conducted. Lamination may be conducted under heat and/or pressure, depending upon the exact composition of the adhesive coat 22. Generally, pressure lamination is conducted by passage through a roll stand such as illustrated at 26, with pressures ranging on the order of 100–400 psi more than adequate to effect bonding of the respective films 2 and 20.

The composite laminate 28 that exits from roll stand 26 is then separated in the final step of the present method, to remove the unwanted portions of the decoration disposed over the masking coat 16. As illustrated in FIG. 1, laminate 28 may be passed through idler roll stand 30 and upon its emergence, the respect films 2 and 20 may be drawn apart, with mask removing film 20, for example, drawn to a take up roll 32. Naturally, both films 2 and 20 may be directed to individual take up rolls, within the scope of this invention.

Referring now to FIG. 2, the schematic cross-sectional illustration of the various layers coated and otherwise combined in accordance with the present method is provided to illustrate the manner in which the respective layers are accumulated, and thereafter separated. Thus, following the illustration from left to right, base film 2 is shown initially, and after passage through coating station 4, wherein primer coat 6 is shown disposed thereon.

The next applied coating as illustrated in FIG. 2 comprises colored coat 12, which is shown herein disposed over the entirety of primer coat 6. Thereafter, masking coat 16 is selectively applied over color coat 12 and is accordingly illustrated as discontinuous in nature. It should be understood that, in the instance where colored coat 12 is not applied, masking coat 16 would be disposed directly over primer coat 6.

The next applied coating comprises the metalized coat 24 disposed over the masking coat 16 as shown. Thereafter, mask removing film 20 with its adhesive coat 22 are brought together against metalized coat 24 to form the laminate identified as 28. In the last illustration of FIG. 2 on the right hand side thereof, the separation of mask removing film 20 from base film 2 is illustrated and it can be seen that the unwanted portions of metalized coat 24, together with masking coat 16, have been removed from base film 2 and are now borne by adhesive coat 22. Base film 2 as completed now defines a metalized and/or colored decoration within certain predetermined areas, and is ready for application to three-dimensional plastic products as a decoration.

The selectively metalized decoration formed in accordance with the present invention may be disposed on a continuous film and appropriately die-cut and thereafter applied to three-dimensional plastic products by in-mold decoration, in accordance with co-pending application Ser. No. 401,275, filed July 23, 1982, for "METHOD FOR PREPARING IN-MOLD DIE-CUT DECORATED LABELS FOR CONTINUOUS APPLICATION" by the inventor herein and Harry A. Parker, commonly assigned herewith. The disclosure of this application is accordingly incorporated herein by reference and made a part hereof.

Figure 3:
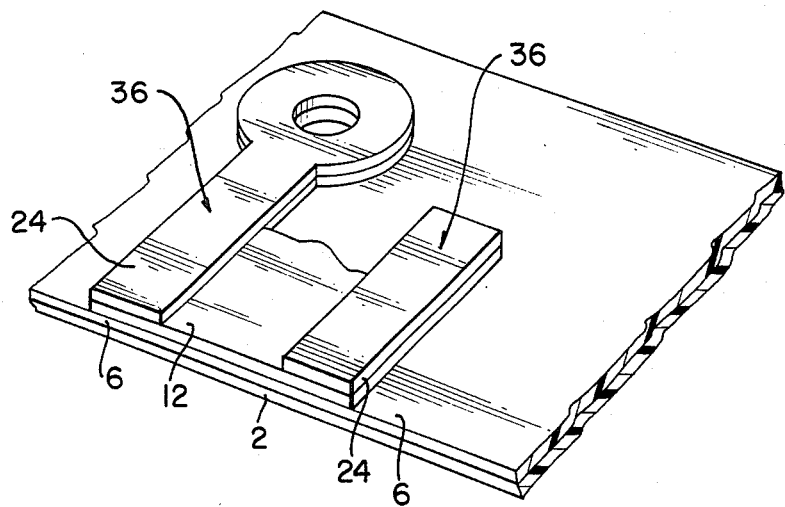
FIG. 3 is a fragmentary schematic perspective illustrating a film product prepared in accordance with the present invention.

Referring now to FIG. 3 a selectively decorated film prepared in accordance with the present invention is illustrated in perspective. Thus, film 2 is shown with a metalized pattern 36 which has been defined by the removal of an appropriate masking coat as illustrated and described previously. The marginal edge or border of the pattern 36 is crisp and by virtue of its accuracy, is capable of unexpectedly superior faithful adherence to minute detail in the pattern or design portrayed. As illustrated, film 2 bears a primer coat 6 over the entirety of its surface, with a color coat 12 that has been selectively applied to define a separate pattern from those defined by patterns 36. It is accordingly apparent that compound decorations may be prepared with intricate patterns possessing a multiplicity of coloration, including a combination of a metalized and a pigmented or dyed surface, all within the scope of the present invention.

The present method affords the opportunity to prepare patterned decorations of extremely intricate design in a manner which is free from the drawbacks of the prior art systems while capable of commercial rates of production. The simplicity of the process and the equipment used therewith lends further economy to the present method, as does its adaptability to variations in product design.

This invention may be embodied in other forms or carried out in other ways without departing from the spirit or essential characteristics thereof. The present disclosure is therefore to be considered as in all respects illustrative and not restrictive, the scope of the invention being indicated by the appended claims, and all changes which come within the meaning and range of equivalency are intended to be embraced therein.

What is claimed is:

1. A method for the preparation of a directly decorated resin film having a selective decoration consisting essentially of:
   A. providing and feeding a printable resin base film to serve as the base of said decorated resin film;
   B. applying a primer coat over an entire broad surface of said base film;
   C. applying over a portion of said primer coat a masking coat abhesive thereto, said masking coat applied in a predetermined pattern defining the outer border of said selective decoration;
   D. applying a metal coat over the entire surface of the coated base film of Step C to completely cover said primer coat and said masking coat and to make direct interfacial contact therewith;
   E. bonding the coated base film of Step D to a mask-removing resin film bearing a pressure-sensitive adhesive coat, with said adhesive coat positioned for contact with said metal coat; and
   F. separating the coated base film of Step E from said mask removing film;

whereby the masking coat and the portions of the metal coat disposed thereover are removed from said base film and adhesively bound to said mask removing film, and whereby said directly decorated resin film consists essentially of said base film bearing said selective decoration comprising said primer coat disposed against said base film and said metal coat disposed against said primer coat.

2. The method of claim 1 wherein subsequent to applying the primer coat of Step B, at least one color coat is applied to at least a part of said primer coat.

3. The method of claim 2 wherein said color coat is applied to the entire surface of said primer coat.

4. The method of claim 3 wherein said color coat is included within said primer coat.

5. The method of claim 2 wherein said color coat is applied to said primer coat in a predetermined pattern.

6. The method of claim 5 wherein said predetermined pattern has a surface area equal to and comprising the surface area of said primer coat to be left uncoated by said masking coat.

7. The method of claim 5 wherein said predetermined pattern has a surface area less than the surface area of said primer coat to be left uncoated by said masking coat.

8. The method of claim 5 wherein plural color coats are applied to said primer coat in mutually exclusive predetermined patterns.

9. The method of claim 8 wherein said predetermined patterns define a total surface area less than that of said primer coat to remain uncoated by said masking coat.

10. The method of claim 2 wherein said selective decoration comprises said primer coat disposed adjacent said base film, said color coat disposed over said primer coat, and said metalized coat disposed over said color coat.

11. The method of claim 1 wherein said masking coat is applied to said primer coat by a screen printing technique.

12. The method of claim 1 wherein said base film and said mask-removing film are laminated under pressure, by passage through pressure rollers.

13. The method of claim 8 wherein said plural color coats are applied consecutively.

14. The method of claim 8 wherein said plural color coats are applied simultaneously by multi-color gravure coating.

* * * * *